United States Patent
Ross et al.

(10) Patent No.: US 9,929,554 B2
(45) Date of Patent: Mar. 27, 2018

(54) POWER BUSWAY INTERPOSER

(71) Applicant: Amazon Technologies, Inc., Reno, NV (US)

(72) Inventors: Peter George Ross, Olympia, WA (US); Robert David Wilding, Seattle, WA (US); Stephanie Towner, Ashland, VA (US); Giorgio Arturo Pompei, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 726 days.

(21) Appl. No.: 14/315,243

(22) Filed: Jun. 25, 2014

(65) Prior Publication Data

US 2015/0380917 A1    Dec. 31, 2015

(51) Int. Cl.
*H02G 5/08* (2006.01)
*H05K 7/14* (2006.01)
(Continued)

(52) U.S. Cl.
CPC .............. *H02G 5/08* (2013.01); *H01R 13/70* (2013.01); *H01R 25/145* (2013.01); *H01R 43/26* (2013.01); *H05K 7/1492* (2013.01)

(58) Field of Classification Search
CPC ...... H01R 13/70; H01R 25/145; H01R 43/26; H02G 5/08; H05K 7/1492
(Continued)

(56) References Cited

U.S. PATENT DOCUMENTS 3,028,460 A * 4/1962 Turton ................ H02G 5/08
                                                200/281
3,605,064 A * 9/1971 Routh ................. H01R 25/145
                                                200/51 R
(Continued)

FOREIGN PATENT DOCUMENTS

DE        3025913        2/1982

OTHER PUBLICATIONS

International Search Report and Written Opinion from PCT/US2015/037341, dated Aug. 7, 2015, Amazon Technologies, Inc., pp. 1-12.
(Continued)

*Primary Examiner* — Thienvu Tran
*Assistant Examiner* — Brian K Baxter
(74) *Attorney, Agent, or Firm* — Robert C. Kowert; Meyertons, Hood, Kivlin, Kowert & Goetzel, P.C.

(57) ABSTRACT

A power busway interposer enables a power busway assembly of energized busway segments to be extended, via coupling additional busway segments to the assembly, while maintaining energization of the assembly. As a result, a power busway assembly providing power support to electrical loads can be extended while maintaining power support to the electrical loads. The interposer includes separate sets of connectors that couple with separate busway segments and a switching device which selectively electrically couples the connectors, so that a power busway connector can be de-energized while another separate power busway connector is coupled to an energized busway segment and then subsequently energized. Extending the power busway assembly can include coupling separate sets of connectors to separate busway segments, where the separate sets of connectors are electrically isolated, and adjusting the switching device to electrically couple the separate sets of connectors,
(Continued)

so that power is distributed between coupled busway segments.

20 Claims, 7 Drawing Sheets

(51) Int. Cl.
*H01R 13/70* (2006.01)
*H01R 25/14* (2006.01)
*H01R 43/26* (2006.01)

(58) Field of Classification Search
USPC .......................................................... 307/147
See application file for complete search history.

(56) References Cited

U.S. PATENT DOCUMENTS

| | | | | |
|---|---|---|---|---|
| 5,214,314 A * | 5/1993 | Dillard | ................... | H01R 25/14 307/147 |
| 5,466,889 A * | 11/1995 | Faulkner | ................ | H02G 5/007 174/133 B |
| 6,296,498 B1 * | 10/2001 | Ross | ................... | H01R 25/145 439/115 |
| 6,358,070 B1 * | 3/2002 | Lin | ...................... | H01R 25/145 439/115 |
| 7,744,386 B1 * | 6/2010 | Speidel | ................ | H01R 25/145 439/118 |
| 7,819,676 B1 * | 10/2010 | Cardoso | ............... | H01R 13/245 439/115 |
| 2007/0066110 A1 * | 3/2007 | West | ........................ | H02G 5/08 439/207 |
| 2010/0238045 A1 * | 9/2010 | Feight | ................ | H04B 10/1141 340/815.45 |
| 2013/0193764 A1 * | 8/2013 | Bailey | .................. | H05K 7/1492 307/66 |
| 2013/0194726 A1 * | 8/2013 | Bailey | .................. | H05K 7/1492 361/637 |
| 2013/0198532 A1 * | 8/2013 | Bailey | ....................... | G06F 1/26 713/300 |
| 2014/0293516 A1 * | 10/2014 | Swift | ....................... | H02B 1/20 361/624 |
| 2015/0129301 A1 * | 5/2015 | Bailey | ..................... | G06F 1/189 174/70 B |
| 2015/0245531 A1 * | 8/2015 | Meinecke | ............. | H02M 3/158 361/679.02 |
| 2015/0288160 A1 * | 10/2015 | Baldwin | .................. | H02G 5/08 439/114 |

OTHER PUBLICATIONS

"Bus Series B60,B100C, B100, B160, B225", Starline Track Busway, Universal Electric Corporation, downloaded May 27, 2014, pp. 1-45.

"Starline Track Busway Systmes", Starline Track Busway System, downloaded May 27, 2014, 1 page.

* cited by examiner

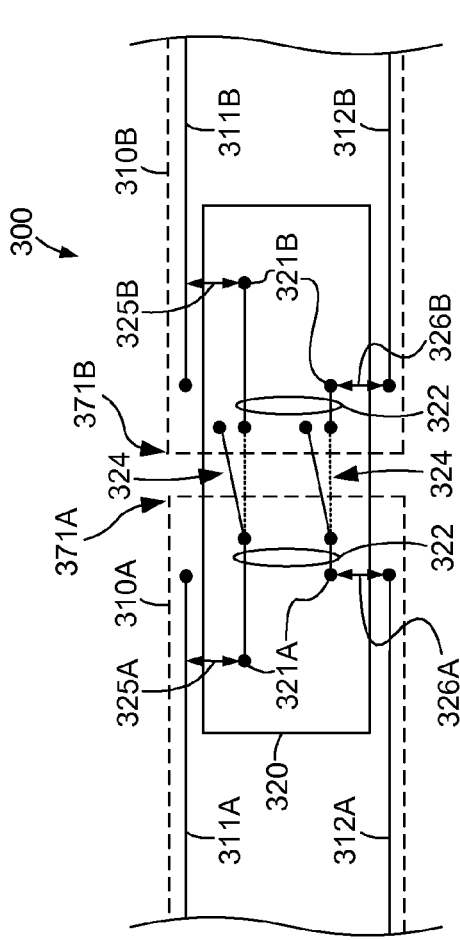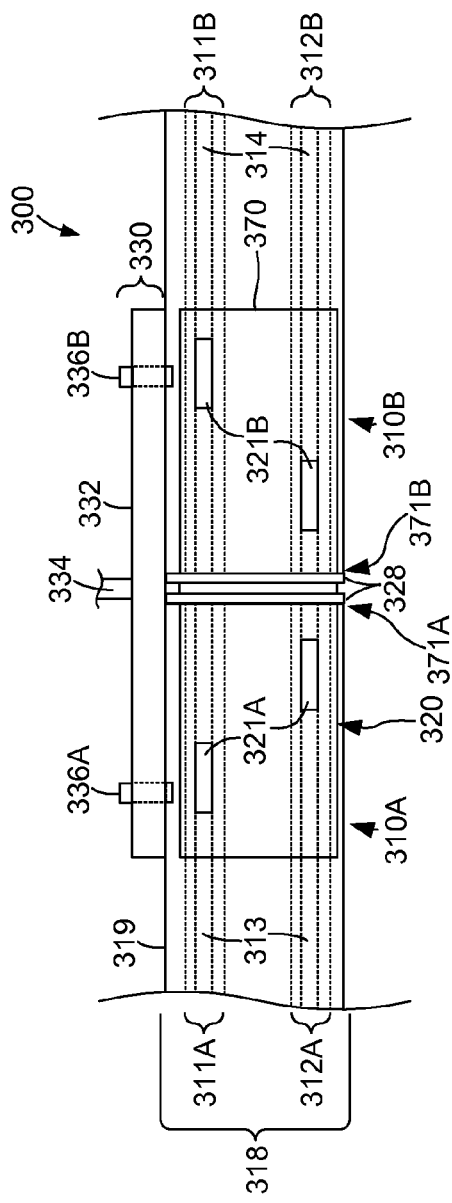

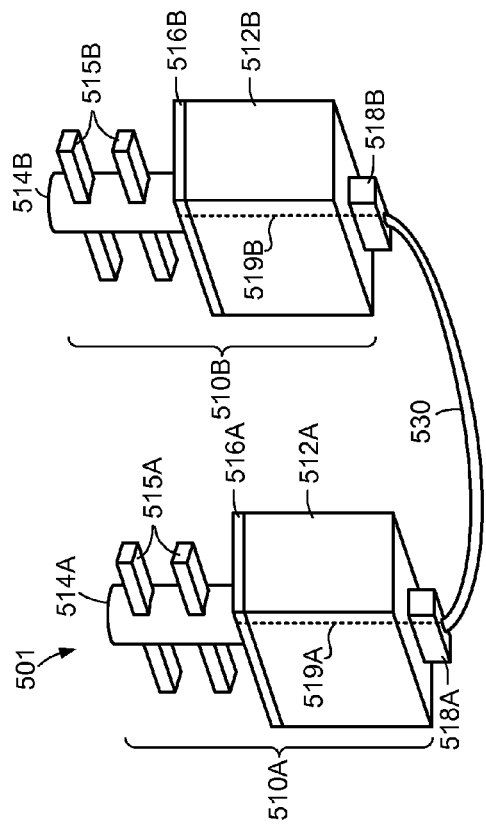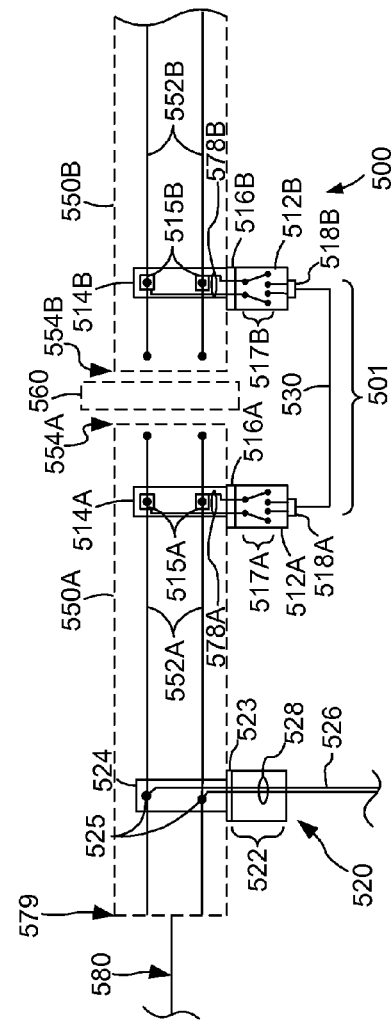
FIG. 5A
FIG. 5B

POWER BUSWAY INTERPOSER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), lay cables, install racks, enclosures, and cooling systems to implement waste heat removal therefrom. Additional time and resources are typically needed to conduct inspections and obtain certifications and approvals, such as for electrical and HVAC systems.

BRIEF DESCRIPTION OF THE DRAWINGS

FIG. 3A-B illustrate a power busway interposer which couples separate power busway segments via separate sets of power busway connectors and a switching device, according to some embodiments.

FIG. 5A-B illustrate a power busway interposer which includes separate tap box assemblies, coupled via a power transmission line, which couple to separate power busway segments to enable distribution of power between the power busway segments via the tap box assemblies and power transmission line, according to some embodiments.

Figure 1:
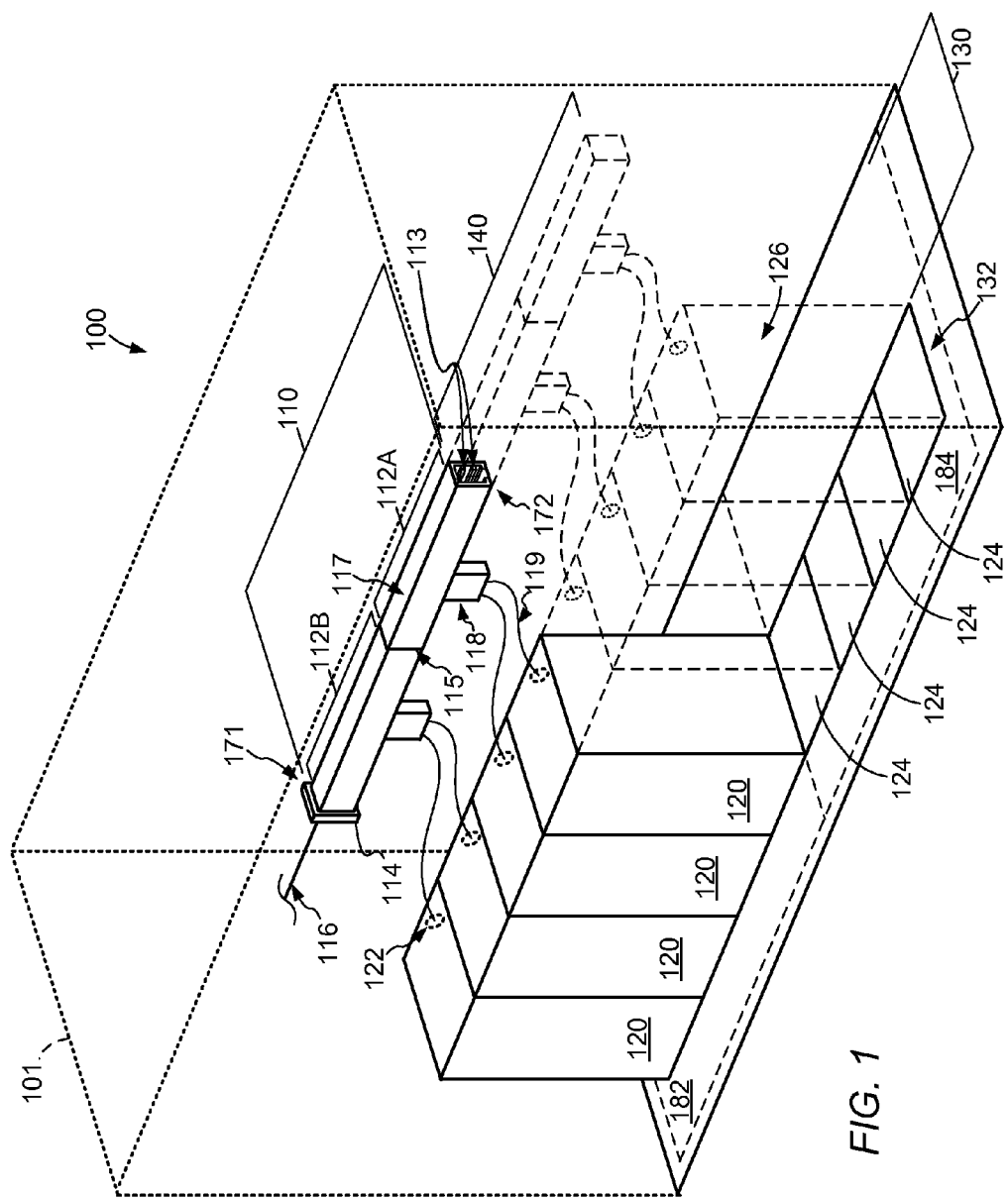
FIG. 1 is a schematic illustrating a perspective view of a computing room in which a power busway assembly of coupled power busway segments at least partially extends and provides power support to various rack computer systems via tap box assemblies, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of power busway interposers for enabling reversible adjustment of an energized power busway assembly are disclosed. According to one embodiment, a data center includes a power busway assembly, which extends through a portion of an aisle space and distributes electrical power to a row of rack computer systems in the portion of the aisle space, and a power busway interposer which enables incremental extension of the power busway assembly through another portion of the aisle space while maintaining distribution of electrical power to the row of rack computer systems. The power busway assembly includes multiple power busway segments coupled in series, and the power busway interposer can couple an additional segment to an energized power busway segment that is at a distal end of the assembly to extend the assembly. The power busway interposer enables coupling of a de-energized additional power busway segment to an energized power busway segment, while maintaining the de-energized state of the additional power busway segment, and subsequent energization of the additional power busway segment via the coupled energized power busway segment.

According to one embodiment, an apparatus includes a power busway interposer which electrically couples separate power busway segments together while maintaining distribution of the electrical power through one of the separate busways, so that another one of the coupled busways can receive electrical power that one coupled busway. The power busway interposer includes separate power busway connectors and a switching device. The separate power busway connecters each couple with a separate power busway. The switching device is coupled to each of the separate connectors and selectively distributes electrical power between the separate coupled busways via the connectors.

According to one embodiment, a method includes configuring a power busway assembly, which includes one or more power busway segments, to be incrementally extended while maintaining energization of the one or more power busway segments. Such configuring of the power busway assembly includes coupling a proximate set of busway connectors of a power busway interposer to the one or more power busway segments; coupling an additional power busway segment to the distal set of busway connectors, subsequent to energizing the at least one power busway segment; and adjusting a switching device of the interposer to electrically couple the proximate and distal sets of busway connectors subsequent to coupling the additional power busway segment. The power busway interposer comprises proximate and distal sets of busway connectors and a switching device configured to selectively electrically couple the proximate and distal sets of busway connectors. Adjusting the switching device to electrically couple the proximate and distal sets of busway connectors enables the power busway interposer to distribute power from the one or more power busway segments to the additional power busway segment via the proximate and distal sets of busway connectors.

As used herein, "computer room" means a room of a building in which computer systems, such as rack-mounted servers, are operated.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a reserve power system may provide reserve power support to an electrical load by providing a reserve power feed that can be selectively routed to the load by a transfer switch that is downstream of the reserve power system and upstream of the load, where the transfer switch may selectively route the reserve power feed or a primary power feed to the load based at least in part upon one or more conditions associated with the primary power feed.

As used herein, "power distribution unit", also referred to herein as a "PDU", means any device, module, component, or combination thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, "floor power distribution unit" refers to a power distribution unit that can distribute electrical power to various components in a computer room. In certain embodiments, a power distribution unit includes a k-rated transformer. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "space" means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

As used herein, a "rack computer system" means a computer system that includes one or more computing devices mounted in a rack.

As used herein, a "busway," "bus duct", etc. may refer to an enclosed module containing one or more bus bars for distribution of electrical power between components of a power distribution system. The enclosed module may be prefabricated and can include bus bars in a protective enclosure. In some embodiments, the terms "bus duct" and "busway" are used interchangeably.

FIG. 1 is a schematic illustrating a perspective view of a computing room in which a power busway assembly of coupled power busway segments at least partially extends and provides power support to various rack computer systems via tap box assemblies, according to some embodiments.

Data center 100 includes a computer room 101 which includes an aisle space 130 and a row 132 of rack positions 124 extending along the aisle space 130, where rack computer systems 120 are installed in a portion of the row 132 to establish a row of rack computer systems 120. A power busway assembly 110 extends through the aisle space 130 and distributes electrical power from a power source 116, to which the power busway assembly 110 is coupled via a feed box 114 at a proximate end 171 of the power busway assembly 110, to the rack computer systems 120 in the aisle space 130, via various coupled tap boxes 118 and power cables 119 coupled to power inlets 122 of the rack computer systems 120, to enable the rack computer systems 120 to perform computing operations.

The power busway assembly 110 includes an assembly of one or more power busway segments 112A-B, where each segment 112 includes an enclosure 117 which at least partially encloses an interior space in which one or more power bus bars 113 are mounted, so that the power bus bars 113 extend through the partially enclosed interior space of each busway segment 112. In some embodiments, each segment 112 has standardized dimensions, including a standardized length, width, height, etc. The segments 112 may have adjacent ends 115 at which separate adjacent segments may be coupled to electrically couple bus bars in the separate busway segments. Coupling separate busway segments can include, as shown in FIG. 1, coupling the separate busway segments in series, at adjacent ends 115, to at least partially establish the power busway assembly 110. An end of one power busway segment 112B may be coupled to the feed box 114. Such a power busway segment 112B, referred to herein as the "proximate power busway segment" 112B, receives electrical power from the power source 116 via the feed box 114 at the proximate end 171 of the assembly 110 and carries the electrical power on one or more power bus bars 113 of the proximate power busway segment 112B. The power busway segment 112A can distribute the electrical power to one or more coupled tap boxes 118, one or more other coupled power busway segments 112A, etc.

The power busway assembly 110, in some embodiments, carries an electrical power feed received from a power source 116, at feed box 114 at the proximate end 171, on the various bus bars 113 included in the assembly 110. The electrical power feed can include an operating power feed, reserve power feed, some combination thereof, etc. Where the assembly 110 includes multiple segments 112A-B coupled in series at adjacent ends 115, the bus bars 113 of the coupled segments 112 can be electrically coupled so that a power busway segment 112A of the assembly 110 that is distal from the feed box 114 (a "distal power busway segment" 112A) carries electrical power received from a coupled power busway segment 112B that is coupled to an end 115 of the distal power busway segment 112A and carries electrical power from the feed box 114.

One or more tap boxes 118 can be coupled to one or more of the power busway segments 112 in the assembly 110, where coupling a tap box 118 to the segment includes electrically coupling a power connector of the tap box with one or more of the bus bars in the power busway segment to enable the tap box 118 to distribute power from the bus bar 113. The tap box can be coupled, via a power cable 119, to one or more power inlets 122 of one or more rack computer systems 120 in the computer room 101, so that the tap box 118 can distribute electrical power, received from a bus bar 113 of a coupled power busway segment 112, to the power inlet 122 of one or more rack computer systems 120 via the one or more power cables 119 coupled to the tap box 118.

In some embodiments, the number of rack computer systems 120 installed in an aisle space 130 of a computer room 101 is less than the number of rack positions 124 in the row 132 extending through the aisle space 130, so that the rack computer systems 120 extend through one portion 182 of the aisle space 130 and a set of available rack positions 124 in which rack computer systems 120 are not installed extend through another portion 184 of the aisle space 130.

In some embodiments, the power busway assembly 110 can be reversibly configured to extend through portions of the aisle space 130 in which rack computer systems 120 are installed, so that the portions of the aisle space 130 through which the power busway assembly 110 extends corresponds to the portions in which rack computer systems are installed. As a result, the power busway assembly 110 may not extend through portions of the aisle space 130 in which rack computer systems are not installed.

In the illustrated embodiment of FIG. 1, for example, where rack computer systems 120 are installed in portion 182 of aisle space 130 and not portion 184, the power busway assembly 110 can be configured to extend through the portion 182 and not portion 184. As a result, the quantity of power distribution infrastructure, which includes power busway segments, tap boxes, bus bars, etc. included in the data center 100 corresponds to the installed rack computer systems 120. Thus, excess power distribution infrastructure at any given time can be minimized.

In some embodiments, one or more instances of power distribution infrastructure are incrementally installed in the data center 100, based at least in part upon incremental installation of additional rack computer systems 120 in the data center. As a result of such incremental installation of infrastructure, the installed power busway segments 112 in one or more power busway assemblies 110 distribute power to installed rack computer systems 120, via one or more tap boxes 118 coupled to the segments 112, and excess busway segments 112 to which tap boxes 118 are not coupled can be minimized.

Incremental installation of power distribution infrastructure, in some embodiments, includes incremental extension of the power busway assembly 110 into additional portions of the aisle space 130, so that the extended power busway assembly 110 is configured to distribute electrical power to rack computer systems installed in the additional portions. Incremental extension of the power busway assembly 110 can include coupling additional power busway segments 140 to the assembly 110, at a distal end 172 of a distal power busway segment 112A of the assembly 110. Additional tap boxes 118 can be coupled to the additional power busway segments 140, and electrical power received at feed box 114 can be distributed through the assembly 110, including through the additional power busway segments 140, to provide power support to rack computer systems 126 installed in the additional portion 184 of the aisle space 130. An additional power busway segment 140 can be coupled to the distal end of the power busway assembly 110, which can be the distal end of distal power busway segment 112A, so that assembly 110 is extended into portion 184, based at least in part upon a determination that one or more rack computer systems 126 are to be installed on available rack positions 124 in portion 184. As a result, the power busway assembly 110 can be extended to provide power support to the rack computer systems 126 in portion 184.

In some embodiments, extending a power busway assembly 110 can include de-energizing the assembly 110, so that the bus bars 113 of the additional power busway segment 140, which is de-energized, are coupled to de-energized bus bars 113 of segment 112A. Coupling a de-energized bus bar 113 to an energized bus bar 113 can pose safety risks to the operator performing the coupling of busway segments. For example, where busway assembly 110 is carrying a 600-amp electrical power feed from power source 116 and through bus bars 113 of segments 112A-B, coupling an additional busway segment 140 to the assembly at the distal end 172, so that a bus bar 113 of the additional busway segment 140 is coupled to the energized bus bar 113 of segment 112A, can pose considerable safety risks to the operator performing the coupling. In addition, de-energizing one or more segments 112A-B of assembly 110, including de-energizing the entire assembly 110, to enable safe coupling of an additional segment 140 to a de-energized bus bar 113 of the assembly 110 can result in a loss of power support to the rack computer systems 120 electrically coupled to segments 112A-B via tap boxes 118.

Figure 2:
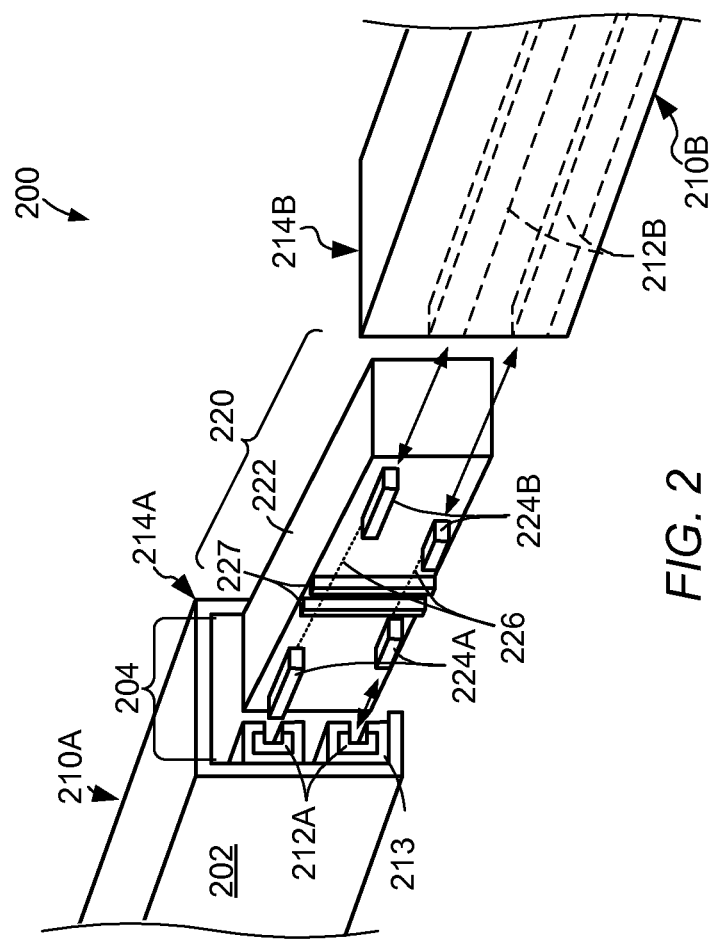
FIG. 2 is a schematic diagram illustrating a perspective view of a power busway assembly which includes separate power busway segments and a power busway interposer which couples the power busway segments, according to some embodiments.

FIG. 2 is a schematic diagram illustrating a perspective view of a power busway assembly which includes separate power busway segments and a power busway interposer which couples the power busway segments, according to some embodiments.

Power busway assembly 200 includes power busway segments 210A-B and a power busway interposer 220. Each of the power busway segments 210A-B includes a respective enclosure 202 which can least partially encloses an interior space 204 in which one or more various bus bars 212A-B are mounted. An enclosure 202 of one or more power busway segments 210A-B can be a metal enclosure, an enclosure of various materials, or the like. One of the various materials can be an electrically insulating material. In the illustrated embodiment, the mounting structure 213 which holds a bus bar 212A in the interior space 204 and couples the bus bar 212A to the enclosure 202 can be an insulator, where the structure 213 is at least partially constructed, formed, etc. of an insulating material.

The bus bars 212A-B can have one or more various configurations. For example, a bus bar 212 can be a flat strip of conductive material. In another example, a bus bar can be a hollow tube structure, where the conductive material at least partially encompasses a hollow interior space. In the illustrated embodiment of FIG. 2, each bus bar 212A-B has a "C" shaped cross section, where a hollow interior space is encompassed on three sides by the bus bar conductive material. Such a shaped bus bar can include a greater surface area to cross sectional area ratio, relative to a flat strip bus bar, to enable more efficient power distribution. A power busway connector can be inserted into the hollow interior space to physically with the bus bar on one or more of the three sides. Conductive material can include one or more various known conductive materials, including copper, brass, aluminum, etc.

In some embodiments, a power busway interposer enables electrical coupling of separate power busway segments to establish, extend, etc. a power busway assembly. The power busway interposer may include power busway connectors that engage with one or more of the separate bus bars of the separate power busway segments, and one or more circuits which electrically couple the connectors, so that electrical power can be distributed between separate bus bars of separate power busway segments via the interposer. In the illustrated embodiment, for example, power busway interposer 220 engages with respective bus bars 212A-B of each of the separate power busway segments 210A-B, via separate power busway connectors 224A-B, to electrically couple the separate bus bars 212A-B of the separate busway segments 210A-B, thereby electrically coupling the separate segments 210A-B and enabling electrical power distribution between the separate power busway segments 210A-B.

For example, where segment 210A is a distal power busway segment of a power busway assembly 200, including segment 112A of assembly 110 illustrated in FIG. 1, segment 210A may be energized, such that one or more of bus bars 213 is carrying an electrical power feed received, at a proximate end of the power busway assembly 200, from a power source. In contrast, power busway segment 210B may be an additional power busway segment which is to be coupled to the distal power busway segment 210A, at a distal end 214A of the segment 210A which can be the distal end of the assembly 200, to extend the assembly 200. Power busway segment 210B may be de-energized, as the bus bars 212B of the segment 210B may be electrically isolated from any power source. Coupling the power busway segments 210A-B, at adjacent ends 214A-B, can include electrically coupling the respective bus bars 212A-B of the segments 210A-B, so that electrical power carried in one or more of bus bars 212A is distributed to one or more of the bus bars 212B of segment 210B to energize the segment 210B, thereby enabling the segment 210B to distribute electrical power to various electrical loads electrically coupled to the bus bars 212B via one or more tap boxes, connectors, etc.

Power busway interposer 220 includes a housing 222 which can include separate sets 224A-B of power busway connectors. Each separate power busway connector in the respective sets 224A-B is configured to be inserted into the hollow interior space of a separate bus bar 212A-B to engage the connector with the bus bar. Where the bus bar is carrying electrical power, also referred to as being "live" or "energized", engaging a connector 224 with a bus bar 212 can include electrically coupling the connector 224 with the bus bar, so that the electrical power carried by the bus bar 212 is distributed at least partially through the coupled connector 224. Electrically coupling can also be referred to as establishing an electrical connection.

Power busway interposer 220 includes a set 226 of electrical circuits which couple the separate sets of power busway connectors 224A-B together. Each circuit 226 couples a connector of set 224A with a corresponding connector of set 224B, so that the respective circuit 226 couples a bus bar 212A that is coupled to a connector 224A with a bus bar 212B that is coupled to a connector 224B, thereby coupling separate segments 210A-B. Where one of the power busway connectors 224 is coupled to an energized bus bar 212, the circuit 226 can establish an electrical connection between corresponding connectors 224A-B to electrically couple separate coupled bus bars 212A-B. In some embodiments, the circuit 226 is configured to carry an entirety of the electrical power feed carried by one or more of the bus bars 212 of one or more of the power busway segments 210A. The entirety of the electrical power feed can include, for example, an 800-amp current.

Power busway interposer 220 includes a set of spacers 227 which each engage with separate adjacent ends 214A-B of coupled separate power busway segments 210A-B when the connectors 224 of the interposer are coupled to bus bars 212A-B in the separate segments 210A-B. Such spacing can hold the adjacent ends 214A-B in particular positions relative to each other when the separate segments 210 are coupled at least partially via the interposer 220.

In some embodiments, where one power busway segment 210A is energized, coupling a set of power busway connectors 224A of a power busway interposer 220 to the energized bus bars 212A of the power busway segment 210A can impose safety risks to operators manipulating the interposer 220 to couple it to the segment 210A. In addition, where an interposer 220 is coupled to an energized power busway segment 210A, the connectors 224B of the interposer that are not coupled to the energized segment 210A, and to which an additional, de-energized power busway segment 210B can be coupled, may be energized by the connectors 224A coupled to the energized segment bus bars and the circuit 226 coupling the separate connectors 224A-B. As a result, coupling a de-energized power busway segment 210B to an interposer 220 that is coupled to an energized power busway segment 210A may can impose safety risks to operators manipulating the interposer, segment, etc. to couple them together. While de-energizing the energized power busway segment 210A may mitigate the safety risk, such de-energizing can result in a loss of power support to one or more various electrical loads, including rack computer systems to which the energized power busway segment 210A is electrically coupled.

FIG. 3A-B illustrate a power busway interposer which couples separate power busway segments via separate sets of power busway connectors and a switching device, according to some embodiments.

Power busway assembly 300 includes two separate power busway segments 310A-B which include separate sets of bus bars 311A-B, 312A-B are coupled by a power busway interposer 320.

Each power busway segment 310A-B includes an upper bus bar 311 and a lower bus bar 312 in an interior space 318 at least partially encompassed by an enclosure 319. In the illustrated embodiment, each bus bar 311, 312 includes a respective hollow interior space 313, 314 which is at least partially encompassed by the conductive material of the respective bus bar 311A-B, 312A-B.

Power busway interposer 320 includes, at least partially in a housing 370, separate sets 321A-B of power busway connectors, circuits 322 which are each coupled to at least one of the power busway connectors 321 and at least partially extending between separate sets 321A-B of connectors, and switching devices 324 which are coupled to separate circuits 322 and can selectively establish or terminate an electrical connection between, thereby selectively electrically coupling, separate connectors 321A-B.

As shown in the illustrated embodiments, a power busway interposer can be at least partially inserted into the interior spaces 318 of the separate busway segments 310A-B to which it couples, via the adjacent ends 371A-B of the segments 310A-B, so that the connectors 321A-B are slidably inserted into the ends to be slidably engaged with one or more separate bus bars 311, 312. Slidably inserting a connector into an end of a busway segment can include slidably inserting the connector into an end of a busway, so that the connector slides through a hollow interior space at least partially encompassed by the conductive material of the bus bar and is slidably engaged with the bus bar. As shown in the illustrated embodiment, for example, the connectors 321A-B are slidably inserted, through a respective end of separate ones of the bus bars 311, 312 at adjacent ends 371, into a hollow interior space 313, 314 of one of the bus bars 311, 312 and slidably inserted through the hollow interior space 313, 314 to slidably engage 325A-B, 326A-B the respective power busway connector 321 with the respective bus bar 311, 312. For example, the upper connector 321A of interposer 320 is slidably inserted, at end 371A of segment 310A, into a hollow interior space 313 of the upper bus bar 311A, so that the connector 321A is slidably engaged 325A with the bus bar 311A.

As shown, the interposer 320 includes separate sets 321A-B of power busway connectors that are in a staggered configuration. As a result, the connectors in a given set 321 couple with separate bus bars 311, 312 in a given power busway segment 310 at different horizontal locations along the length of the power busway segment, so that the separate connectors in the given set 321 are coupled with the separate bus bars of the segment 310 at different horizontal distances from the end 371 of the segment through which the interposer 320 is inserted. Power busway interposer 320 includes a set of spacers 328 which each engage with separate adjacent ends 371A-B of coupled separate power busway segments 310A-B when the connectors 321A-B of the interposer are coupled to bus bars 311, 312 in the separate segments 310A-B. Such spacing can hold the adjacent ends 371A-B in particular positions relative to each other when the separate segments 310A-B are coupled at least partially via the interposer 320. In some embodiments, one or more of the spacers 328 includes an electrical insulating element.

In some embodiments, a power busway interposer includes a switching device that selectively electrically couples separate power busway connectors in the interposer. The switching device can include one or more circuit breaker devices. In the illustrated embodiment, interposer 320 includes a set of switching devices 324 that each is coupled, at separate ends, to separate power busway connectors 321A-B via separate circuits 322.

Each switching device 324 can be adjustably positioned to one or more various positions to selectively electrically couple or decouple the separate power busway connectors 321A-B which are coupled to separate ends of the switching device 324. For example, in the illustrated embodiment, each switching device 324 can be adjustably positioned to an open position or a closed position, and the switching devices 324 are both illustrated in the open position. When a switching device 324 is in the open position, the separate connectors 321A-B coupled to the separate ends of the switching device 324 are electrically isolated from each other, so that electrical power cannot be distributed between the separate connectors 321A-B via the circuits 322 and the switching device 324. When a switching device 324 is in the closed position, the separate connectors 321A-B coupled to the separate ends of the switching device 324 are electrically coupled to each other, so that power can be distributed between the separate connectors 321A-B via the circuits 322 and the switching device 324.

In some embodiments, an interposer 320 which includes the switching devices 324 enables selective distribution of power between separate power busway segments 310A-B coupled to the separate sets of connectors 321A-B of the power busway interposer 320. Such selective distribution allows, for example, one set of connectors 321A to be energized by one busway segment 310A, while another set of connectors 321B is electrically isolated from connectors 321A by switching devices 324 and are therefore de-energized. As a result, a de-energized power busway segment 310B can be coupled to the interposer 320, via coupling bus bars 311B-312B with de-energized connectors 321B, to couple the segments 310A-B together without coupling a de-energized bus bar with an energized connector. Subsequent to the bus bars 311B-312B of the de-energized segment 310B being coupled with the de-energized connectors 321B of interposer 320, thereby coupling the segments 310A-B together, the switching devices 324 can be adjustably positioned to establish electrical connections between connectors 321A-B, thereby electrically coupling the segments 310A-B via the electrically coupled connectors 321A-B and enabling connectors 321B, and thus the bus bars 311B-312B of segment 310B, to be energized.

As a result, interposer 320 enables a power busway assembly 300 to be extended, via coupling separate power busway segments 310 together, where one segment 310A is an energized power busway segment of the assembly 300, while maintaining energization of segment 310A and mitigating safety risks by enabling the additional, de-energized segment 310B to couple with a de-energized interposer connector prior to electrically coupling the separate power busway segments 310A-B together via the interposer to enable power distribution between the separate segments 310A-B.

In some embodiments, although interposer 320 can electrically couple the separate segments 310A-B, the interposer 320 does not provide full structural support to the coupling to hold the separate segments 310A-B in place relative to each other, support the separate segments 310 in an assembly in a particular location in a room, etc. In some embodiments, a support element physically couples to each separate enclosure 319 of the separate power busway segments 310A-B to provide structural support and stability to the segments 310A-B, which can include holding the separate segments 310A-B in a particular position, relative to each other. In the illustrated embodiment, for example, support element 330 provides structural support and stability to the coupled segments 310A-B. Element 330 includes a support bracket 332 which extends between the separate enclosures 319 of the separate segments 310A-B, and coupling elements couple the separate enclosures 319 to the bracket 332. The coupling elements 336A-B can at least partially transfer the structural load of the separate enclosures 319 to the bracket 332. Anchor 334 physically couples the bracket 332 to a fixed structure, which can include one or more of a ceiling module of a room module, a structural member of a room, etc. The anchor 334 can transfer at least some of the structural load of the enclosures 319 of the separate segments 310A-B to the fixed structure via the coupling elements 336A-B and bracket 332.

Figure 4:
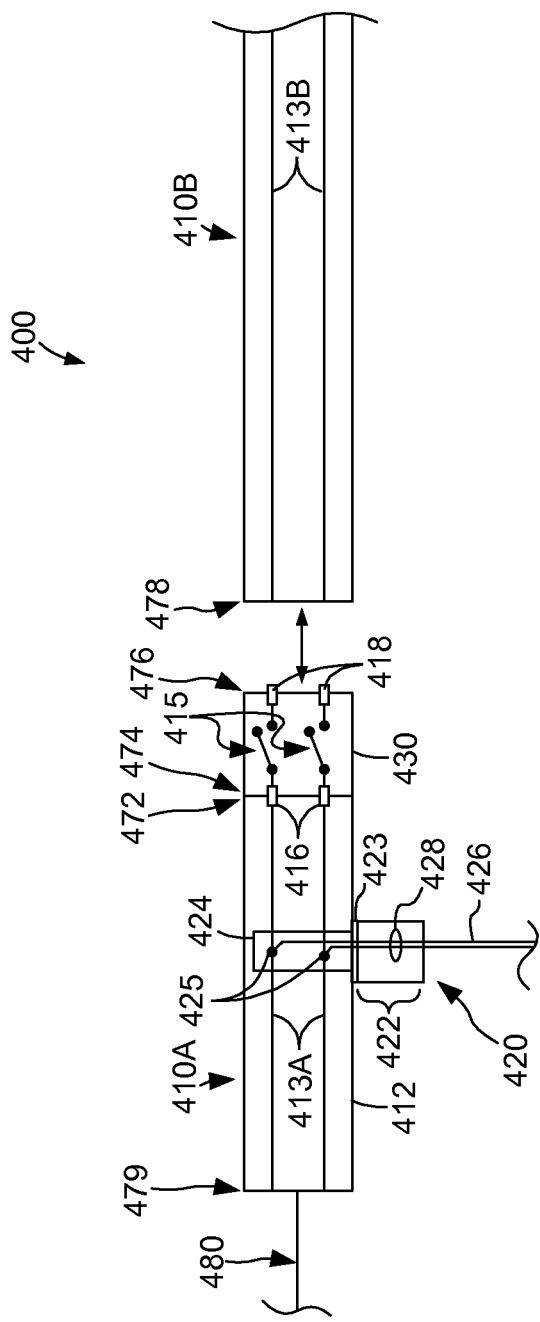
FIG. 4 is a schematic diagram illustrating an energized power busway segment and a coupled power busway interposer which couples the energized power busway segment with a de-energized power busway segment while maintaining power distribution to electrical loads via a coupled tap box assembly, according to some embodiments.

FIG. 4 is a schematic diagram illustrating an energized power busway segment and a coupled power busway interposer which couples the energized power busway segment with a de-energized power busway segment while maintaining power distribution to electrical loads via a coupled tap box assembly, according to some embodiments.

In some embodiments, a power busway interposer can be coupled to a distal end of a power busway segment prior to energization of the power busway segment from a power source coupled to a proximate end of the segment, where a switching device in the interposer can enable an exposed power busway connector at the distal end of the interposer to remain de-energized, while a power busway connector at the proximate end of the interposer is coupled to the energized segment and is energized. As a result, a de-energized power busway segment can be coupled to the exposed, de-energized connectors of the interposer so that the separate busway segments are physically coupled, via the interposer, while remaining electrically isolated. Subsequent to coupling the de-energized segment to the de-energized connectors as the distal end of the interposer, the switching devices in the interposer can be adjusted to electrically couple the connectors at the proximate end of the interposer to the connectors as the distal end of the interposer, thereby electrically coupling the energized power busway segment to the additional power busway and enabling distribution of electrical power from the energized power busway segment to the additional power busway segment via the interposer, thereby energizing the additional power busway segment.

In some embodiments, each power busway segment includes an interposer incorporated into the distal end of the segment, where the proximate end of an additional power busway segments can be coupled to a distal end of an energized power busway segment of a power busway assembly without imposing safety risks due to electrically coupling separate power busway segments through physically coupling them together.

In the illustrated embodiment, power busway assembly 400 includes a power busway segment 410A and an additional power busway segment 410B, and a power busway interposer 430 which is coupled, at a proximate end 474, to a distal end 472 of the power busway segment 410. In some embodiments, power busway assembly 400 can be at least part of assembly 110 illustrated in FIG. 1.

Power busway segment 410A includes two bus bars 413A extending through the length of the segment 410A, at least to a location proximate to the distal end 472 of the segment 410A. One or more of the bus bars 413A can be energized by a power source 480, received at a proximate end 479 of the segment 410A.

In some embodiments, one or more tap box assemblies 420 can be coupled to the power busway segment 410 to electrically couple with one or more of the bus bars 413A and distribute electrical power from the coupled bus bars to one or more electrical loads. In the illustrated embodiment, tap box assembly 420 includes a tap box housing 422 which is coupled to the enclosure 412 of the power busway segment via a coupling element 423. A busway connector 424 is inserted into the interior space of the busway segment 410A when the tap box 422 is coupled to the segment 410A via coupling element 423. Connector 424 includes one or more separate coupling elements 425 which can each separately engage with a separate bus bar 413A to electrically couple with the bus bar, thereby electrically coupling the tap box assembly 420 with the power busway segment 410A.

Tap box assembly 420 includes one or more circuits 428 extending through the housing 422 and connector 424 to couple with one or more coupling elements 425, and electrical power received at a coupling element 425 from a coupled bus bar 413A can be distributed through the connector 424 and housing 422 via the one or more circuits 428. Tap box assembly 420 includes one or more power cables 426 which are coupled to the tap box housing and are electrically coupled to the circuits 428, so that electrical power received at coupling elements 425 from bus bars 413A can be distributed to the power cables 426 via circuits 428. The power cables 426 can be coupled to one or more electrical loads to electrically couple one or more of the bus bars 413A of segment 410A to the electrical loads, via tap box assembly 420 which is electrically coupled to the segment 410A. The circuits 428 can, in some embodiments, include one or more switching devices, including circuit breakers, which selectively electrically couple or decouple the electrical loads that are coupled to tap box assembly 420, via power cables 426, from the power busway segment 410A. Such switching devices may be included in the tap box housing 422.

Power busway assembly 400 includes a power busway interposer 430 which is coupled, via proximate power busway connectors 416 at a proximate end 474 of the interposer 430, to the power busway segment 410A at the distal end 474 of the segment 410A. Connectors 416 are each coupled to one or more of the separate bus bars 413A of the segment 410A, thereby electrically coupling at least the connectors 416 of the interposer 430 with the power busway segment 410A.

Power busway interposer 430 includes one or more switching devices 415 which couple proximate power busway connectors 416 at the proximate end 474 of the interposer 430 with distal power busway connectors 418 at the distal end of the interposer 430. Each separate switching device 415 couples a separate proximate connector 416 with a separate distal connector 418. Each separate switching device can be adjustably positioned to selectively electrically couple or electrically decouple ("isolate") the separate connectors 416, 418 together via the switching device 415 to which the separate connectors are coupled at separate ends of the switching device 415. A switching device 415 can include one or more circuit breaker devices. Where power busway connectors 416 are engaged with bus bars 413A to couple interposer 430 with power busway segment 410A, the power busway connectors 416 can be in an interior of the coupled segment 410A and interposer 430 and thus obscured from an exterior of same, and power busway connectors 418 at the distal end 476 of the interposer 430 can be thus be referred to as exposed distal power busway connectors 418.

In some embodiments, a switching device 415 in an interposer 430 which is coupled to a distal end 472 of a power busway segment 410A is positioned in an open position, so that at least two separate connectors 416, 418 in the interposer 430 are electrically isolated from each other, so that an energized one of the connectors does not energize the other one of the connectors. For example, where interposer 430 is coupled to power busway segment 410A, such that connectors 416 are each coupled to a separate bus bar 413A of the segment 410A, and the segment 410A is energized so that bus bars 413A are carrying an electrical power feed, the connectors 416 which are electrically coupled to the bus bars 413A receive electrical power from the bus bars 413A and are thus energized, while one or more of the connectors 418 at the distal end 476 of the interposer 430, being electrically isolated from one or more of connectors 416 based at least in part upon one or more of switching devices 415 being in an open position, remain de-energized. As a result, a proximate end 478 of an additional power busway segment 410B can be coupled to the distal end 476 of interposer 430, which can include coupling the exposed distal power busway connectors 418 to the bus bars 413B of the segment 410B, without exposing the bus bars 413B to energization upon being engaged with the de-energized connectors 418 of the interposer 430.

Subsequent to coupling the segment 410B to the interposer 430, such that bus bars 413B are each engaged with one or more of the de-energized distal power busway connectors 418, one or more of the switching devices 415 can be adjustably positioned into a closed position to electrically couple separate connectors 416, 418, thereby electrically coupling bus bars 413A of segment 410A with the bus bars 413B of segment 413B, so that the electrical power feed being carried on bus bars 413A is distributed to bus bars 413B via interposer 430. The additional segment thus becomes energized, and the electrical power feed can be distributed from the additional segment 410B to various electrical loads via coupling one or more tap box assemblies 420 to the additional power busway segment 410B.

In some embodiments, a proximate end of an interposer 430 is coupled to a distal end 474 of a power busway segment 410A prior to energization of the segment 410A from a power source. For example, where segment 410A is coupled to another power segment to receive electrical power from a power source, interposer 430 may be coupled to the distal end 474 of the segment 410A, via slidably engaging one or more proximate power busway connectors 416 with one or more bus bars 413A, while segment 410A is de-energized, and segment 410A may be subsequently energized, such that at least power busway connectors 416 are energized.

Where a power busway interposer 430 is coupled, at a proximate end 474, with power busway segment 410A, the power busway interposer 430 may be a part of the distal end 472 of the power busway segment 410A, so that the distal end 476 of coupled interposer 430 is the distal end of power busway segment 410A. In some embodiments, each distal end of each power busway segment in power busway assembly 400 includes a power busway interposer integrated into the distal end.

FIG. 5A-B illustrate a power busway interposer which includes separate tap box assemblies, coupled via a power transmission line, which couple to separate power busway segments to enable distribution of power between the power busway segments via the tap box assemblies and power transmission line, according to some embodiments.

In some embodiments, a power busway interposer includes two separate tap box assemblies which are configured to be selectively electrically coupled to each other via one or more power transmission lines, based at least in part upon an adjustable positioning of one or more switching devices included in the power busway interposer. Each separate tap box assembly can be separately coupled to a separate power busway segment, and the switching device can be adjustably positioned to electrically couple the separate tap box assemblies, to electrically couple the separate power busway segments together.

In the illustrated embodiment of FIG. 5A, power busway interposer 501 includes separate tap box assemblies 510A-B which are coupled via a power cable 530 which is coupled to separate power interfaces 518A-B on each of the separate tap box housings 512A-B of the separate tap box assemblies 510A-B. Each separate tap box assembly 510A-B includes a separate coupling element 516A-B which can physically couple the respective tap box assembly 510A-B with a separate enclosure of a separate power busway segment. The plug head 514A-B of each tap box assembly 510A-B can extend into an interior space at least partially encompassed by the enclosure of the respective power busway segment, when coupling element 516A-B is coupled to the respective enclosure, and the power busway connectors 515A-B of each connector can engage with one or more bus bars extending through the interior space of the enclosure. One or more circuits 519A-B can be coupled, at one end, to one or more of the power busway connectors 515A-B and, at another end, to the power interface 518A-B, so that one or more power busway connectors 515A-B in a tap box assembly 510A-B can be electrically coupled to the power cable 530. Electrical coupling two elements, as referred to herein, can also be referred to as establishing an electrical connection between the two elements, which can enable electrical power distribution between the two elements via the electrical connection In one example, when a power busway connector 515A of one tap box assembly 510A is engaged with a bus bar in a power busway segment, which can include power busway connector 515A electrically coupling with the bus bar, electrical power carried by that bus bar can be distributed, through the connector 514A, tap box housing 512A, and interface 518A of the respective tap box assembly 510A, based at least in part upon connector 515A and the coupled circuit 519A. The electrical power can be further distributed from interface 518A and through a coupled power transmission line 530, to be distributed through the coupled separate tap box assembly 510B to be distributed to a bus bar, of a separate power busway segment, which is electrically coupled with one or more connectors 515B of the tap box assembly 510B. In some embodiments, the power transmission line includes one or more power cables.

One or more switching devices may be included in one or more of the tap box assemblies and, in some embodiments, are configured to be adjustably positioned to selectively electrically couple or isolate the separate power busway connectors 515A-B of the separate tap box assemblies 510A-B from each other, thereby selectively electrically coupling power busway segments to which the separate tap box assemblies 510A-B may each be separately coupled. The switching devices may be included in or more of circuits 519A-B, where the switching devices may be configured to be adjustably positioned to selectively close or open the respective circuit 519, thereby selectively electrically coupling or isolating components coupled to the separate ends of the respective circuit. In some embodiments, the switching devices are included in one or more of the tap box housings 512A-B of the tap box assemblies 510A-B.

FIG. 5B illustrates power busway interposer 501 coupled to separate power busway segments 550A-B of a power busway assembly 500. Each separate tap box assembly 510A-B is separately coupled, via a separate coupling element 516A-B, to a separate enclosure of a separate power busway segment 550A-B, so that the separate plug head 514A-B of each separate tap box assembly 510A-B is inserted into the interior space of the respective power busway segment 550A-B and one or more power busway connectors 515A-B of the respective tap box assemblies 510A-B is engaged with one or more bus bars 552A-B extending through the interior space of the respective power busway segment 550A-B. As a result, the separate bus bars 552A-B of the separate power busway segments 550A-B are coupled together via the separate tap box assemblies 510A-B and a power transmission line 530, which can include one or more power cables, which couples the separate tap box assemblies 510A-B together.

In some embodiments, power busway assembly 500 is included in the power busway assembly 110 illustrated in FIG. 1. For example, power busway segment 550A can be the distal power busway segment 112A in assembly 110.

In the illustrated embodiment of FIG. 5B, each tap box assembly 510A-B includes a separate set of switching devices 517A-B which can each be independently adjustably positioned to selectively electrically couple one or more of the power busway connectors 515A-B of the respective assembly 510A-B with the power transmission line 530. Where switching devices 517A-B in each of the assemblies 510A-B are positioned in a closed position that electrically couples the respective power busway connectors 515A-B of the separate tap box assemblies 510A-B with the power transmission line 530, the separate power busway connectors 515A-B can be electrically coupled together, thereby electrically coupling separate bus bars 552A-B to which the separate connectors 515A-B are electrically coupled.

The power busway interposer 501 can enable selectively electrically coupling two or more separate power busway segments, so that electrical power can be distributed between the separate power busway segments, while maintaining energization of at least one of the power busway segments. Such coupling can include coupling one of the tap box assemblies of the interposer with an energized power busway segment, where the tap box assembly's switching devices are in an open position, and then subsequently coupling another tap box assembly, coupled to the first tap box assembly via a power transmission line, to another separate power busway segment that is de-energized. As at least one switching device in the coupled tap box assemblies can be in an open position during the coupling of the other tap box assembly to the de-energized power busway segment, a tap box assembly included in the power busway interposer can be electrically isolated from an energized power busway segment to which another tap box assembly is coupled. As a result, an interposer which includes separate coupled tap box assemblies, where one tap box assembly is coupled to an energized power busway segment, can include a tap box assembly that itself includes connectors and coupling elements which are de-energized when the coupling elements connect with the bus bars of the de-energized power busway segment. Subsequent to the a tap box assembly being coupled to the de-energized power busway segment, one or more switching devices in the power busway interposer can be adjustably positioned to a closed position to electrically couple the power busway connectors of the separate tap box assemblies, so that the separate bus bars to which the separate assemblies are coupled are electrically coupled. As a result, where one of the separate power busway segments is energized, electrically coupling the separate bus bars of the separate power busway segments can result in the de-energized power busway segment becoming energized by electrical power received from the energized power busway segment via the coupled tap box assemblies of the interposer which are each coupled to a separate one of the separate power busway segments.

For example, where power busway segment 550A is energized, so that electrical power is being carried by bus bars 552A, tap box assembly 510A can be physically coupled to the enclosure of segment 550A, via coupling element 516A, to position plug head 514A in the interior space of the segment 550A and position power busway connectors 515A to engage with the energized bus bars 552A, thereby electrically coupling the power busway connectors 515A with bus bars 552A, thus energizing the power busway connectors 515A. One or more switching devices 517A may be in an open position, so that tap box assembly 510B remains electrically isolated from the energized power busway connectors 515A, resulting in power busway connectors 515B being de-energized. Subsequent to coupling tap box assembly 510A with segment 550A, tap box assembly 510B can be coupled to a de-energized power busway segment 550B, so that the de-energized power busway connectors 515B of the assembly 510B are engaged with de-energized bus bars 552B of segment 550B, and one or more switching devices 517A-B can subsequently be adjustably positioned to a closed position to electrically couple the tap box assemblies, thereby enabling electrical power distribution from bus bars 552A to bus bars 552B via interposer 501, thus energizing power busway segment 550B.

In some embodiments, coupling separate power busway segments via a power busway interposer that includes tap box assemblies can includes mounting an insulator element between the adjacent ends of the coupled separate power busway segments. As shown in the illustrated embodiment, a power busway interposer 501 which includes separate tap box assemblies may not extend between the two segments at a common elevation with the two segments, extend through the adjacent ends of the adjacent separate power busway segments, etc., such as the interposers shown in FIG. 2-4, but rather extend between the separate segments at a separate elevation, including the illustrated interposer 501 extending between the separate segments 550A-B at a lower elevation relative to the two segments 550A-B. As a result, the adjacent ends 554A-B of the separate segments 550A-B can be separated by open space. In some embodiments, the electrical power feed distributed through the bus bars 552A-B, interposer 501, etc. are of sufficient current, voltage, etc. that electrical arcing between the adjacent ends 554A-B may be possible. As a result, an insulating element 560 may be mounted between the adjacent ends 554A-B of separate power busway segments 550A-B that are coupled together by a interposer 501, to mitigate the risk of electrical arcing between the separate bus bars 552A-B of the separate power busway segments through the adjacent ends 554A-B. The insulating element can include any known insulating materials. In some embodiments, the insulating element 560 is physically coupled to one or both of the adjacent ends 554A-B of the separate power busway segments 550A-B. In some embodiments, the insulating element 560 is included in the power busway interposer 501. For example, the insulating element can be coupled to one or more of the tap box assemblies 510A-B, power transmission line 530, etc.

In some embodiments, the power busway interposer is configured to carry the full electrical feed carried by one power busway segment to another coupled power busway segment. For example, where a power busway segment 550A includes bus bars 552A which are carrying an 800-amp electrical power feed, interposer 501 can be configured to substantially carry the entire 800-amp power feed between the coupled power busway segments 550A-B, so that bus bars 552B of segment 550B substantially carry an entirety of the 800-amp electrical power feed. As used herein, substantially carrying an entirety of an electrical power feed includes carrying an entirety of the electrical power feed within the manufacturing and material tolerances of the elements carrying the feed.

In some embodiments, one or more tap box assemblies 517A-B can be coupled to a power busway segment that is already energized. For example, the illustrated power busway segment 550A can be receiving electrical power, via a power source 580 coupled to end 579, so that the bus bars 552A are energized and carry the received electrical power. The energized power busway segment 550A can be distributing electrical power to one or more electrical loads via one or more tap box assemblies which electrically couple with one or more of the bus bars 552A and distribute electrical power from the coupled bus bars to one or more electrical loads. In the illustrated embodiment, tap box assembly 520 includes a tap box housing 522 which is coupled to the enclosure of the power busway segment 550A via a coupling element 523. A busway connector 524 is inserted into the interior space of the busway segment 550A when the tap box 522 is coupled to the segment 550A via coupling element 523. Connector 524 includes one or more separate coupling elements 525 which can each separately engage with a separate bus bar 552A to electrically couple with the bus bar, thereby electrically coupling the tap box assembly 520 with the energized power busway segment 550A.

Tap box assembly 520 includes one or more circuits 528 extending through the housing 522 and connector 524 to couple with one or more coupling elements 525, and electrical power received at a coupling element 525 from a coupled bus bar 552A can be distributed through the connector 524 and housing 522 via the one or more circuits 528. Tap box assembly 520 includes one or more power cables 526 which are coupled to the tap box housing and are electrically coupled to the circuits 528, so that electrical power received at coupling elements 525 from bus bars 552A can be distributed to the power cables 526 via circuits 525. The power cable 526 can be coupled to one or more electrical loads to electrically couple one or more of the bus bars 552A of segment 550A to the electrical loads, via tap box assembly 520 which is electrically coupled to the segment 550A. The circuits 528 can, in some embodiments, include one or more switching devices, including circuit breakers, which selectively electrically couple or decouple the electrical loads that are coupled to tap box assembly 520, via power cables 526, from the power busway segment 550A. Such switching devices may be included in the tap box housing 522.

In some embodiments, one or more connectors of a power busway interposer are coupled to energized bus bars of an energized power busway segment. Where a power busway interposer includes a tap box assembly, such coupling with an energized power busway segment can include coupling a tap box assembly connector with the energized bus bars of the power busway segment. For example, in the illustrated embodiment, where power busway segment 550A is energized and distributed electrical power from energized bus bars 552A to one or more electrical loads, via tap box assembly 520, interposer 501 can be coupled to the energized power busway segment 550A via coupling tap box assembly 510A with the energized segment 550A, so that plug head 514A is positioned within the interior space of segment 550A to engage connectors 515A with the energized bus bars 552A.

Figure 6:
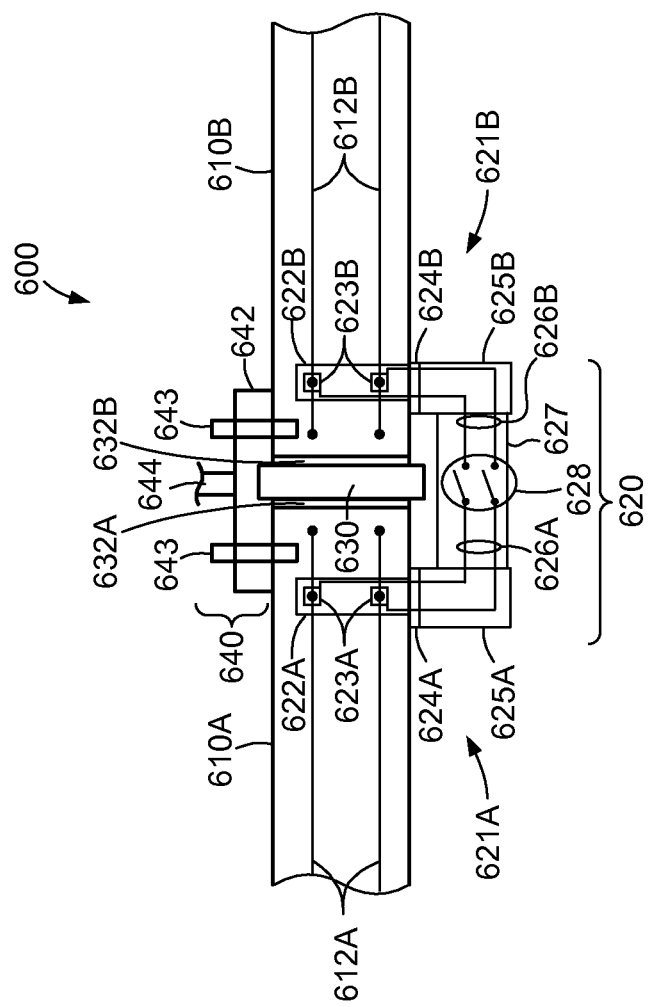
FIG. 6 illustrates a power busway interposer which includes separate tap box assemblies, coupled via a switching device component, which couple to separate power busway segments to enable distribution of power between the power busway segments via the tap box assemblies and the switching device component, according to some embodiments.

FIG. 6 illustrates a power busway interposer which includes separate tap box assemblies, coupled via a switching device component, which couple to separate power busway segments to enable distribution of power between the power busway segments via the tap box assemblies and the switching device component, according to some embodiments.

Power busway assembly 600 includes separate power busway segments 610A-B and a power busway interposer 620 which couples the separate segments 610A-B together, based at least in part upon coupling, at separate tap box assemblies 621A-B of the interposer 620, with separate sets of bus bars 612A-B extending through the separate segments 610A-B.

In some embodiments, a power busway interposer which includes separate tap box assemblies includes a bridge element 627 which is coupled, at separate ends, to the separate tap box assemblies 621A-B and includes one or more various circuits 626A-B which can electrically couple to one or more of the power busway connectors 623A-B of the separate tap box assemblies 621A-B. The circuits 626A-B can each be coupled, at one end, to separate ends of one or more switching devices 628 included in the bridging element 627, where the switching devices 628 are configured to be adjustably positioned to selectively electrically couple or electrically isolate the separate circuits 626A-B coupled to the separate ends of the switching devices 628. As a result, the switching devices 628 can selectively electrically couple or electrically isolate the separate tap box assemblies 621 of the interposer 620, thereby selectively electrically coupling the separate power busway segments 610A-B to which the separate tap box assemblies 621A-B are coupled via separate respective power busway connectors 623A-B. In addition, as shown in the illustrated embodiment, the tap box assemblies 621A-B may be free from including switching devices in the respective assemblies 621, and a single set of switching devices 628 may be adjustably positioned to selectively electrically couple the power busway connectors 623A-B of the separate assemblies 621A-B.

In some embodiments, bridging element 627 is a rigid housing extending between the separate tap box assemblies 621A-B, where the bridging element 627 is coupled, at opposite ends, to separate tap box housings 625A-B of the separate tap box assemblies 621A-B. As a result, the separate tap box assemblies 621A-B of the interposer 620 may be coupled to separate power busway segments concurrently, as the rigid bridging element 627 may fix the relative position of each of the tap box assemblies 621A-B relative to each other. For example, where coupling element 624A of tap box assembly 621A is coupled to the enclosure of power busway segment 610A, so that plug head 622A is positioned within the interior space of the segment 610A to position power busway connectors 623A to engage with one or more of bus bars 612A, the other tap box assembly 621B, being held in a fixed position relative to assembly 621A by bridging element 627, may be concurrently coupled to the enclosure of power busway segment 610B via coupling element 624B, so that plug head 622B is positioned within the interior space of the segment 610B to position power busway connectors 623B to engage with one or more of bus bars 612B. Thus, power busway connectors 623A-B can be positioned, concurrently, in the separate interior spaces of separate power busway segments 610A-B to connect with the respective separate bus bars 612A-B of the separate power busway segments 610A-B.

Switching device 628 may be adjustably positioned to an open position to electrically isolate the separate power busway connectors 623A-B, so that coupling one set of power busway connectors 623A with an energized bus bar 612A does not cause power busway connectors 623B to become energized. Subsequent to the separate tap box assemblies 621A-B being coupled to the separate power busway segments 610A-B, such that the separate power busway connectors 623A-B of the separate tap box assemblies 621A-B are each coupled to a separate set of bus bars 612A-B, switching devices 628 can be adjustably positioned into a closed position, so that the power busway connectors 623A-B are electrically coupled via the bridging element 627. Where one of the coupled bus bars 612A-B is energized, positioning the switching device 628 to a closed position to electrically couple the separate power busway connectors 623A-B can cause another one of the coupled bus bars 612A-B to become energized, based at least in part upon distribution of electrical power from the energized power busway segment to the other power busway segment via the tap box assemblies 621A-B and bridging element 627.

In some embodiments, an insulating element 630 is included in one or more of the interposer 620, a support element 640 which transfers at least some of the structural load of one or more of the power busway segments 610A-B to a fixed structure via support bracket 642, coupling elements 643, anchor 644, etc. In some embodiments, insulating element 630 physically couples with adjacent ends of the separate power busway segments 610A-B via separate coupling elements 632A-B at opposite faces of the insulating element 630.

In some embodiments, power busway assembly 600 is included in the power busway assembly 110 illustrated in FIG. 1. For example, power busway segment 610A can be the distal power busway segment 112A in assembly 110.

Figure 7:
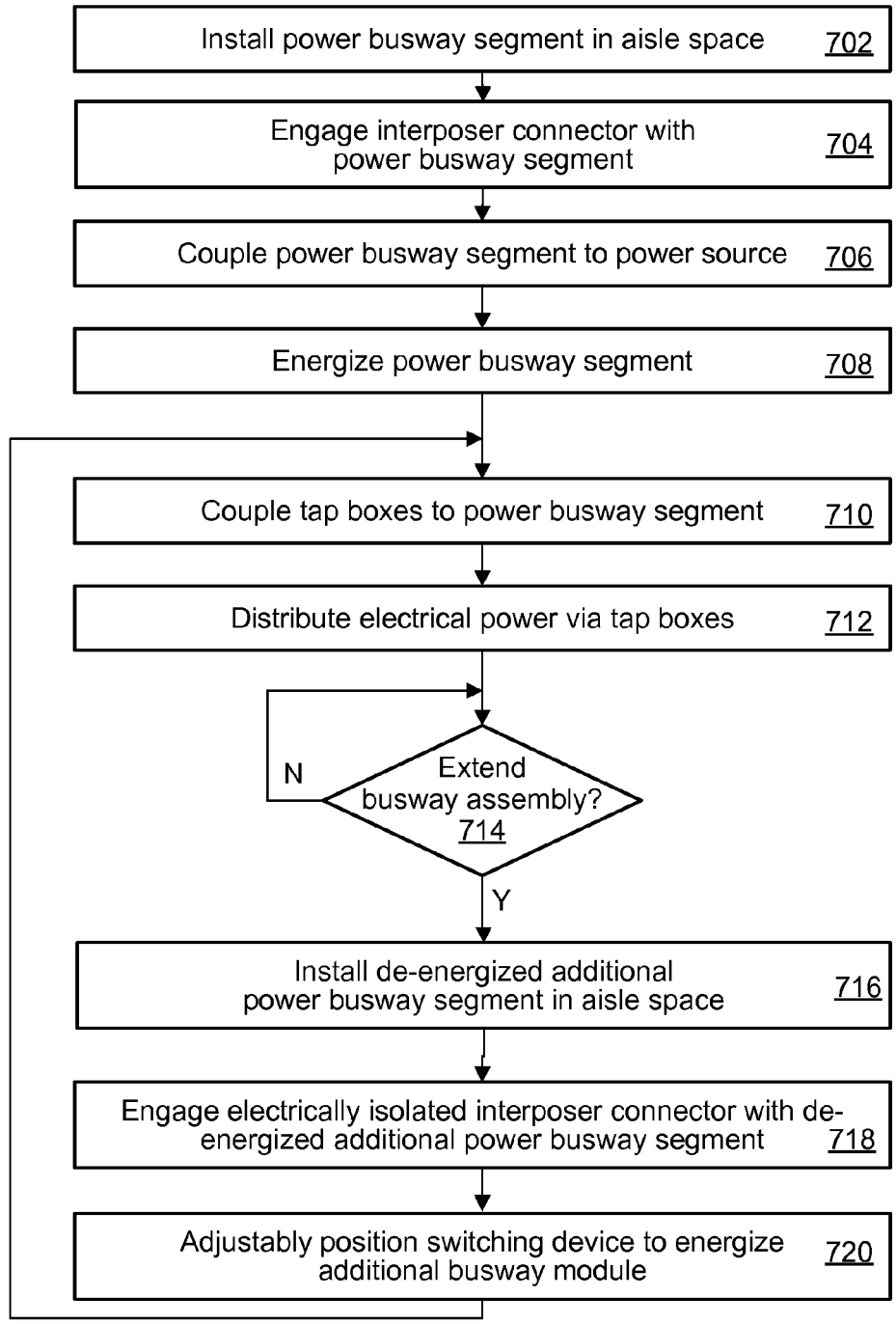
FIG. 7 illustrates configuring a power busway assembly to provide power support to electrical loads and extending the power busway assembly while maintaining power support to the electrical loads, according to some embodiments.

FIG. 7 illustrates configuring a power busway assembly to provide power support to electrical loads and extending the power busway assembly while maintaining power support to the electrical loads, according to some embodiments. Configuring a power busway assembly can include configuring one or more of various power busway assemblies, segments, interposers, etc. as illustrated above in FIG. 1-6.

At 702, one or more power busway segments are installed in an aisle space, so that the power busway segments comprise a power busway assembly which extends through one or more portions of the aisle space. The power busway segments can include one or more enclosures at least partially encompassing an interior space, with one or more bus bars extending through the interior space. The power busway segments comprising the assembly can include two or more power busway segments coupled in series at adjacent ends. One of the segments, referred to as the proximate power busway segment, can extend to an end of the aisle space and can be coupled, at a proximate end of the segment, to a feed box. Another one of the segments, referred to as a distal power busway segment, can be at an opposite end of the assembly and end at a distal end of the segment, which can also be the distal end of the power busway assembly.

At 704, a power busway interposer is coupled to a power busway segment in the power busway assembly, via one or more sets of power busway connectors of the power busway interposer. The power busway interposer can be coupled to the distal power busway segment. The power busway interposer can be configured to be slidingly inserted into the distal end of the busway, as shown in FIG. 2-3, to slidingly engage one or more power busway connectors with one or more bus bars in the distal power busway segment. The power busway interposer may include a tap box assembly configured to be coupled with the enclosure of the busway, as shown in FIG. 5-6, to position one or more coupling elements to electrically couple with one or more of the bus bars of the power busway segment. The power busway interposer can include one or more switching devices which are positioned in an open position concurrently with coupling the interposer to the power busway segment, so that at least one set of power busway connectors in the interposer is electrically isolated from the connectors which are coupled with the bus bars in the power busway segment to which the interposer is coupled.

At 706, one or more of the power busway segments are coupled to a power source. The coupling can include coupling one or more ends of a power busway segment, including a proximate end, to a feed box and coupling the feed box to a power transmission line which is electrically coupled to the power source, so that electrical power can be distributed from the power source, through the power transmission line, through the feed box, and to one or more bus bars included in the power busway segment.

At 708, the one or more power busway segments in the power busway assembly are energized. Energization can include distributing electrical power from a power source to the various power busway segments in the power busway assembly via the feed box coupled to a proximate end of a proximate power busway segment of the assembly. Where the power busway segments in the power busway assembly are each coupled in series, electrical power from the power source can be distributed through the various power busway segments, including the distal power busway segment. Where at least one set of power busway connectors are coupled to one or more of the energized power busway segments, including the distal power busway segments, at least the power busway connectors engaged with the energized power busway segment may be energized. Where the power busway interposer includes a switching device that is positioned in an open position to isolate the energized power busway connector from another one or more power busway connectors, the other one or more power busway connectors may remain de-energized.

At 710-712, one or more tap box assemblies are coupled to one or more energized power busway segments in the power busway assembly, and coupled to one or more electrical loads via one or more power cables, to distribute electrical power from one or more of the energized bus bars in the power busway segments to one or more electrical loads. As a result, one or more of the power busway segments in the power busway assembly provides power support to one or more electrical loads. Electrical loads can include one or more rack computer systems, power distribution units, automatic transfer switches, etc.

At 714, a determination is made regarding whether to extend the power busway assembly into an additional portion of the aisle space. Such a determination can be based at least in part upon a determination regarding whether electrical loads are to be installed in the additional portion of the aisle space. Determinations that electrical loads are to be installed in the additional portion of the aisle space can include receiving an indication that one or more electrical loads are inbound for delivery to the aisle space, have been ordered for delivery to the aisle space, have been received at a location proximate to the aisle space, etc. The additional portion of the aisle space may have previously been free from electrical loads and power busway assemblies and may have included positions that demarcate the positions into which electrical loads may be installed in the future.

At 716, based at least in part upon a determination that the power busway assembly is to be extended, an additional power busway segment can be installed in the aisle space at a position that is proximate to the distal power busway segment of the power busway assembly. An insulating element can be mounted between adjacent ends of the distal power busway segment and the additional power busway segment. The end of the additional power busway segment that is adjacent to the distal end of the distal power busway segment may be referred to as the proximate end of the additional power busway segment. A power busway interposer may be coupled to an opposite distal end of the additional power busway segment. The additional power busway segment may not be electrically coupled to any power source, such that the bus bars of the additional power busway segment, and thus the segment itself, are de-energized. Such an additional power busway segment can referred to as a de-energized additional power busway segment.

At 718, one or more power busway connectors of the power busway interposer which is coupled to one or more of the power busway segments of the power busway assembly are engaged with the additional power busway segment. Engaging a power busway connector with a power busway segment includes engaging the power busway connector with a bus bar included in the power busway segment. The power busway connectors which are engaged with the one or more power busway segments can include one or more de-energized power busway connectors which are electrically isolated from one or more energized power busway connectors which are engaged with one or more energized bus bars of the distal power busway segment. The power busway connectors which are engaged with the additional power busway segment can include one or more distal power busway connectors which are coupled to, and electrically isolated from, one or more energized power busway connectors via one or more switching devices in the interposer. Thus, the power busway connectors which are engaged with the additional power busway segment can be de-energized, in addition to the additional power busway segment being de-energized.

At 720, one or more switching devices included in the power busway interposer are adjustably positioned to electrically couple the additional power busway segment with the distal power busway segment, via electrically coupling the separate power busway connectors of the interposer. Where the distal power busway segment is energized, such that the power busway connectors engaged with the bus bars of the distal power busway segment are energized, adjustably positioning the switching devices to electrically couple the additional power busway segment, which can be a de-energized additional power busway segment, with the energized distal power busway segment can cause the additional power busway segment to be energized, via electrical power from the power busway assembly, so that electrical power carried via at least the distal power busway segment of the power busway assembly is distributed to one or more bus bars of the additional power busway segment via the electrically coupled power busway connectors of the power busway interposer. Where the additional power busway segment is coupled, via at least a power busway interposer, to a distal power busway segment of the power busway assembly, the energized additional power busway segment may be referred to as incorporated into the power busway, such that the power busway assembly is extended and the additional power busway segment is the new distal power busway segment of the power busway assembly. Energizing the additional power busway segment can include adjustably positioning one or more switching devices in the power busway interposer to a closed position to electrically couple one or more power busway connectors engaged with one or more bus bars of an energized power busway segment with one or more power busway connectors coupled with one or more bus bars of the additional power busway segment.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    an aisle space comprising a row of rack computer systems which extend through at least one portion of the aisle space;
    an energized power busway assembly, extending through the at least one portion of the aisle space and comprising a plurality of energized power busway segments coupled in series, wherein:
        the energized power busway assembly is configured to distribute electrical power, received from a power source at a proximate end of the power busway assembly, to the row of rack computer systems, and
        the plurality of energized power busway segments includes a distal energized power busway segment at a distal end of the power busway assembly; and
    a power busway interposer configured to:
        couple an additional power busway segment to the energized distal power busway segment at the distal end of the power busway assembly, such that the additional power busway segment is electrically isolated from the energized distal power busway segment, and
        subsequent to the coupling, selectively electrically couple the additional power busway segment to the energized distal power busway segment to energize the additional power busway segment.

2. The data center of claim 1, wherein the power busway interposer comprises:

a plurality of separate power busway connectors, each configured to couple with separate power busway segments to couple the additional power busway segment to the energized distal power busway segment;

wherein each power busway connector of the plurality of separate power busway connectors is configured to be slidably inserted into an end of a separate power busway segment to slidably engage with at least one bus bar of the separate power busway segment.

3. The data center of claim 1, wherein the power busway interposer comprises:

at least two separate tap box assemblies; and at least one power transmission line electrically coupling the at least two separate tap box assemblies;

wherein, to couple the additional power busway segment to the energized distal power busway segment, the power busway interposer is configured to couple each of the separate tap box assemblies with a separate power busway segment.

4. The data center of claim 1, wherein:

the power busway interposer is configured to couple the additional power busway segment to the energized distal power busway segment to enable incremental extension of the power busway assembly through at least one additional portion of the aisle space.

5. An apparatus, comprising:

a power busway interposer configured to couple at least two separate power busway segments together and selectively energize at least one of the coupled power busway segments via a separate energized power busway segment of the coupled power busway segments, wherein the power busway interposer comprises:

at least two separate power busway connectors, wherein each separate power busway connector is configured to couple with a separate power busway segment of the at least two separate power busway segments; and a switching device, coupled to each of the at least two separate power busway connectors and configured to selectively electrically couple the at least two separate power busway connectors to selectively energize the at least one of the coupled power busway segments via the separate energized power busway segment of the coupled power busway segments.

6. The apparatus of claim 5, wherein:

each of the at least two separate power busway connectors is configured to be slidably inserted into an end of a separate power busway segment of the at least two separate power busway segments to slidably engage with at least one bus bar of the separate power busway segment, such that the power busway interposer extends at least partially between adjacent ends of the at least two separate power busway segments to which the power busway interposer is coupled.

7. The apparatus of claim 5, wherein the power busway interposer comprises:

at least two separate tap box assemblies, wherein each of the separate tap box assemblies comprises a separate one of the at least two separate power busway connectors and is configured to couple with a power busway segment to couple the separate power busway connector with at least one bus bar of the power busway segment; and at least one power transmission line extending at least partially between the at least two separate tap box assemblies;

wherein, to selectively enable distribution of electrical power between the at least two separate busway segments, via the at least two separate power busway connectors, the power busway interposer is configured to:

couple each of the at least two separate tap box assemblies to separate one of the at least two separate power busway segments, via respective power busway connectors, and selectively electrically couple the at least two separate power busway segments, via the separate tap box assemblies and the at least one power transmission line.

8. The apparatus of claim 7, wherein:

the power transmission line comprises a power cable coupling the at least two separate tap box assemblies together and configured to distribute power from one tap box assembly to another tap box assembly.

9. The apparatus of claim 7, wherein the power transmission line is configured to substantially carry an entirety of the power feed carried by at least one of the at least two separate power busway segments.

10. The apparatus of claim 7, comprising:

an insulation element configured to be mounted to adjacent ends of the at least two separate power busway segments to preclude electrical arcing between the adjacent ends of the at least two separate power busway segments.

11. The apparatus of claim 5, wherein:

the power busway interposer is coupled to an end of at least one power busway segment of the at least two power busway segments, via at least one of the power busway connectors, prior to energization of the at least one power busway segment;

at least another one of the power busway connectors is coupled with the at least one of the power busway connectors via the switching device; and to selectively electrically couple the at least two separate power busway segments, via the at least two separate power busway connectors, the power busway interposer is configured to:

couple the at least another one of the power busway connectors with another end of another at least one power busway segment, concurrently with the at least one power busway segment being energized and the switching device being positioned in an open position, and adjustably position the switching device to a closed position, subsequent to coupling the at least another one of the power busway connectors with another end of the other at least one power busway segment, to electrically couple the energized at least one power busway segment with the other at least one power busway segment.

12. The apparatus of claim 5, wherein:

the power busway interposer is configured to electrically couple at least two separate power busway segments together to extend a power busway assembly to enable electrical power distribution to at least one set of electrical loads, concurrently with installation of the at least one set of electrical loads in an aisle space.

13. A method, comprising:

configuring a power busway interposer to incrementally extend an energized power busway assembly, wherein the energized power busway assembly comprises at least one power busway segment, and the power busway interposer comprises a proximate busway connector, a distal power busway connector, and a switching device configured to selectively electrically couple the proximate busway connector and the distal power busway connector, wherein the configuring comprises:
  coupling the proximate power busway connector of the power busway interposer to the at least one power busway segment;
  coupling the distal power busway connector to a de-energized additional power busway segment, subsequent to coupling the proximate power busway connector to the at least one power busway segment and concurrently with the switching device being positioned to electrically isolate the distal power busway connector from the proximate power busway connector; and
  adjustably positioning the switching device, subsequent to coupling the distal power busway connector to the de-energized additional power busway segment, to electrically couple the proximate power busway connector and the distal power busway connector.

14. The method of claim 13, comprising, subsequent to coupling the proximate power busway connector to the at least one power busway segment:
  adjustably positioning the switching device to electrically isolate the distal power busway connector from the proximate power busway connector; and
  energizing the at least one power busway segment, such that:
    the proximate power busway connector receives electrical power from the at least one power busway segment, and
    the distal power busway connector, electrically isolated from the proximate power busway connector via the switching device, is de-energized.

15. The method of claim 13, wherein:
  coupling a proximate power busway connector to the at least one power busway segment, and coupling an additional power busway segment to the distal power busway connector, comprises inserting at least one power busway connector into an end of a separate power busway segment to slidably engage the at least one power busway connector with at least one bus bar in an interior space of the respective power busway segment.

16. The method of claim 13, wherein:
the power busway interposer comprises:
  at least two separate tap box assemblies, each of which comprises a respective one of the proximate power busway connector and the distal power busway connector and is configured to couple with a separate power busway segment to engage the respective power busway connector with at least one bus bar of the respective power busway segment; and
  at least one power transmission line extending at least partially between the at least two tap box assemblies;

coupling the proximate power busway connector to the at least one power busway segment comprises coupling a tap box assembly including the proximate power busway connector to the at least one power busway segment; and
coupling an additional power busway segment to the distal power busway connector comprises coupling the another separate tap box assembly including the distal power busway connector to the additional power busway segment.

17. The method of claim 16, wherein:
the power transmission line comprises a power cable configured to electrically couple the separate tap box assemblies together, such that the power busway interposer is configured to distribute power from the at least one power busway segment to the additional power busway segment via the power cable.

18. The method of claim 16, comprising:
mounting an insulation element to an end of the at least one power busway segment; and
mounting an end of the additional power busway segment to the insulation element, prior to coupling the additional power busway segment to the distal power busway connector, such that the insulation element is configured to preclude electrical arcing between adjacent ends of the at least one power busway segment and the additional power busway segment.

19. The method of claim 16, wherein the power transmission line is configured to substantially carry an entirety of the electrical power feed carried by at least one of the at least one power busway segment and the additional power busway segment.

20. The method of claim 13, wherein:
the energized power busway assembly extends through a portion of a data center aisle space which includes a row of rack computer systems;
the at least one power busway segment is electrically coupled to at least one rack computer system of the row of rack computer systems, such that the energized power busway assembly is configured to distribute electrical power to the at least one rack computer system via the at least one power busway segment; and
configuring the power busway interposer to incrementally extend an energized power busway assembly comprises coupling the distal power busway connector to a de-energized additional power busway segment, such that the energized power busway assembly is extended through an additional portion of the aisle space, based at least in part upon a determination that an additional rack computer system is to be installed in the additional portion of the aisle space, to configure the energized power busway assembly to distribute electrical power to the additional rack computer system.

* * * * *